US008299856B2

(12) United States Patent
Blair

(10) Patent No.: US 8,299,856 B2
(45) Date of Patent: Oct. 30, 2012

(54) POWER TRANSISTOR OUTPUT MATCH NETWORK WITH HIGH Q RF PATH AND LOW Q LOW FREQUENCY PATH

(75) Inventor: Cynthia Blair, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 12/973,613

(22) Filed: Dec. 20, 2010

(65) Prior Publication Data

US 2012/0154053 A1   Jun. 21, 2012

(51) Int. Cl.
*H03F 3/191* (2006.01)
(52) U.S. Cl. ........................................ 330/302; 330/307
(58) Field of Classification Search .................. 330/302, 330/305, 307
See application file for complete search history.

(56) References Cited

U.S. PATENT DOCUMENTS

| | | | | |
|---|---|---|---|---|
| 7,138,872 | B2 * | 11/2006 | Blednov | 330/302 |
| 7,372,334 | B2 * | 5/2008 | Blair et al. | 330/302 |
| 2008/0231373 | A1 * | 9/2008 | Rahman et al. | 330/302 |

OTHER PUBLICATIONS

Pending U.S. Appl. No. 12/817,869, filed Jun. 17, 2010 entitled "Voltage Spike Protection for Power DMOS Devices", first-named inventor: Blair.

* cited by examiner

*Primary Examiner* — Khanh V Nguyen
(74) *Attorney, Agent, or Firm* — Murphy, Bilak & Homiller, PLLC

(57) ABSTRACT

A power circuit includes a power device, an output match network and a bypass network. The output match network is coupled to an output of the power device and includes a blocking capacitor which forms part of a high quality factor RF path of the output match network. The output match network is operable to provide a range of impedance matching over a signal bandwidth and a low frequency gain peak outside the signal bandwidth which corresponds to a low frequency resonance of the high quality factor RF path. The bypass network is coupled in parallel with the blocking capacitor of the output match network. The bypass network is operable to attenuate the low frequency gain peak while maintaining the high quality factor RF path.

14 Claims, 5 Drawing Sheets

POWER TRANSISTOR OUTPUT MATCH NETWORK WITH HIGH Q RF PATH AND LOW Q LOW FREQUENCY PATH

BACKGROUND

Typical RF power transistors incorporate an inductive shunt output impedance matching network having a distinctive gain signature which is a function of the series and parallel resonances of the output match network. The output match network typically includes a blocking capacitor for blocking DC. The characteristics of the capacitor in concert with circuit inductances, creates a low frequency resonance which causes a high gain area in the response of the device at low frequencies e.g. between 1 to 300 MHz. The high gain area is undesired and may cause problems with the harmonic content of DPD systems, or worse, negative consequences arising from high peak drain voltages appearing as a result of gain peak coincident, heterodyne frequencies generated by multiplying signals using a nonlinear component such as a power transistor. The output of such a nonlinear operation yields sinusoidal terms with frequencies at the sum and difference of the original signal frequencies, plus the original frequencies and at multiples of the original frequencies which are commonly referred to as harmonics.

The amplitude at the power amplifier drain is higher than the observed gain at the output of the match network because blocking capacitors provided outside the device attenuate the gain peak to some degree. However, the low frequency gain peak can cause the peak drain voltage of the power transistor to surpass the breakdown voltage of the device under certain conditions. For example, any unintended system artifacts appearing in the region of the low frequency gain peak are strongly amplified and impact performance and/or cause device overstress. In another example, broadband signals may have a baseband component coincident with the low frequency gain peak which can impact performance and/or cause device overstress when amplified due to the low frequency gain peak. Any sharp change in gain at low frequencies can limit video bandwidth, and adversely affect the ability of a power device to function properly with a digital predistortion system.

The power device is overstressed when the peak drain voltage exceeds the breakdown voltage of the device. If the un-desired low frequency gain peak is suppressed, this peak voltage can be lowered. Other methodologies are: Low frequency input trap circuits which are not very effective at mitigating low frequency gain peaks in the frequency response of a typical output match network. Low frequency input trap circuits can also cause instabilities or limit video bandwidth. The value of the blocking capacitor included in the output match network can be increased, moving the gain peak into a lower frequency region. However, doing so has a very negative impact on video bandwidth. This methodology also has little or no effect on peak voltages at the device drain. On-chip feedback can be provided to mitigate an undesirable low frequency gain peak, but at the risk of introducing instabilities. On-chip feedback circuits are also difficult to implement without sacrificing performance.

SUMMARY

According to an embodiment of a power circuit, the power circuit includes a power device, an output match network and a bypass network. The output match network is coupled to an output of the power device and includes a blocking capacitor which forms part of a high quality factor RF path of the output match network. The output match network is operable to provide a range of impedance matching over a signal bandwidth and a low frequency gain peak outside the signal bandwidth which corresponds to a low frequency resonance of the high quality factor RF path. The bypass network is coupled in parallel with the blocking capacitor of the output match network and is operable to attenuate the low frequency gain peak while maintaining the high quality factor RF path. High frequency RF is blocked from the bypass circuit.

According to an embodiment of a method of operating a power circuit, the method includes coupling an output match network to an output of a power device, the output match network including a blocking capacitor which forms part of a high quality factor RF path. The method further includes providing a range of impedance matching over a signal bandwidth and a low frequency gain peak outside the signal bandwidth which corresponds to a low frequency resonance of the high quality factor RF path, coupling a bypass network in parallel with the blocking capacitor of the output match network and attenuating the low frequency gain peak via the bypass network while maintaining the high quality factor RF path.

According to an embodiment of a circuit package, the package includes a substrate, a first die on the substrate, an output terminal on the substrate, an output match network and a bypass network. The first die includes an LDMOS (or other) power device. The output match network couples an output of the power device to the output terminal. The output match network includes a blocking capacitor which forms part of a high quality factor RF matching path. The blocking capacitor is included in a second die on the substrate. The output match network is operable to provide a range of impedance transformation over a signal bandwidth and an un-desired low frequency gain peak outside the signal bandwidth. The bypass network is coupled in parallel with the blocking capacitor of the output match network. The bypass network is operable to attenuate the low frequency gain peak while maintaining the high quality factor RF path.

According to an embodiment of a method of fabricating a circuit package, the method includes providing a substrate, arranging a first die on the substrate, the first die including a power device, arranging an output terminal on the substrate, and coupling an output of the power device to the output terminal via an output match network including a blocking capacitor which forms part of a high quality factor RF path. The blocking capacitor is included in a second die on the substrate, and the output match network is operable to provide a range of impedance transformation over a signal bandwidth and an un-desired low frequency gain peak outside the signal bandwidth. The method further includes coupling a bypass network in parallel with the blocking capacitor of the output match network, the bypass network being operable to attenuate the low frequency gain peak while maintaining the high quality factor RF path.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
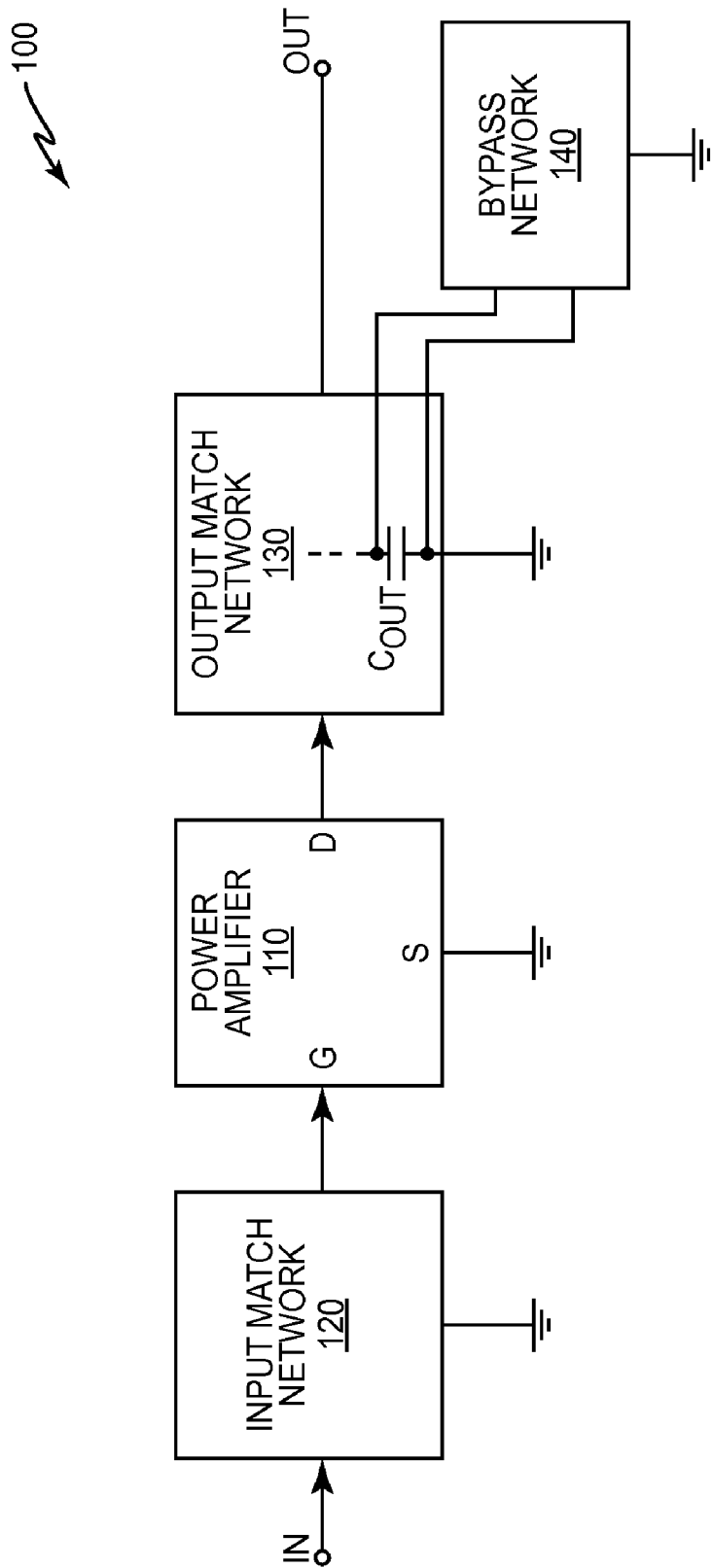
FIG. 1 illustrates an embodiment of a power circuit including a power device, an output match network and a bypass network.

FIG. 1 illustrates an embodiment of a power circuit 100. The power circuit 100 includes a power device 110, an input match network 120, an output match network 130, and a bypass network 140. The input match network 120 is coupled between an input terminal (IN) of the power circuit 100 and the gate (G) of the power amplifier 110. The output match network 130 is coupled between the drain (D) of the power amplifier 110 and an RF (OUT) of the power circuit 100 and also possibly a DC/baseband port which is not shown for ease of illustration only. The power device 110 can be any type of power transistor such as a MOS (metal-oxide-semiconductor) power transistor, DMOS (double-diffused metal-oxide-semiconductor) transistor, LDMOS (laterally diffused metal oxide semiconductor) transistor, etc. and more generally any type of RF device. For example, the power amplifier 110 can be a broadband power transistor in some embodiments and therefore used in video and/or wireless applications. The power amplifier 110 can be a multi-carrier amplifier that mixes at least two signals of different bandwidths, a multi-band amplifier, an LTE (long term evolution) compliant amplifier, a WCDMA (wideband code division multiple access) compliant amplifier, an 802.11(x) compliant amplifier, etc.

In general, the inductive shunt output match network 130 of the power circuit 100 has a distinctive gain signature which is a function of the series and parallel resonances of the output match network 130. Particularly, a blocking capacitor $C_{OUT}$ of the output match network 130 forms part of a high quality factor RF path of the output match network 130. The blocking capacitor $C_{OUT}$ cuts off DC, the combination of LC components around this DC block form resonances resulting in a high gain spike at the drain of the power amplifier 110 at low frequencies e.g. in the 1 to 300 MHz range.

The output match network 130 therefore provides a range of high frequency impedance matching over a desired signal bandwidth and an undesirable low frequency gain peak outside the signal bandwidth which corresponds to the low frequency resonance of the high quality factor RF path. The range of high frequency matching can start at 500 MHz or above, and range into the GHz range. The low frequency gain peak can cause the peak drain voltage of the power amplifier 110 to surpass the breakdown voltage of the device under certain conditions e.g. when unintended system artifacts appearing in the region of the low frequency gain peak are strongly amplified, when a baseband component of a broadband signal which is coincident with the low frequency gain peak is strongly amplified by the gain spike, etc.

The bypass network 140 of the power circuit 100 is designed to attenuate the low frequency gain peak in the frequency response of the output match network 130. The bypass network 140 is coupled in parallel with the blocking capacitor $C_{OUT}$ of the output match network 130. The bypass network 140 attenuates the low frequency gain peak in the low frequency range while maintaining the high quality factor RF path of the output match network 130 in the high frequency range. This way, the power amplifier 110 has a lower peak drain voltage in the low frequency range. In addition, the high frequency performance of the power circuit 100 is essentially unaffected by the bypass network 140, or at least only minimally affected. In one embodiment, the power amplifier 110 multiplies a signal having a bandwidth in the GHz range with a signal having a bandwidth in the MHz range so that a low frequency gain peak occurs between 1 and 300 MHz. The low frequency gain peak between 1 and 300 MHz is attenuated by the bypass network 140 while signal energies in the GHz range are relatively unaffected by the bypass network 140. The low frequency gain peak may occur in a different low frequency range, and depends on the bandwidths of the signals mixed by the power amplifier 110. In general, the bypass path of the bypass network 140 is low Q e.g. by having a resistor in series with a coil and the bypass path blocks RF via a high inductive reactance which is negligible at low frequencies.

Figure 2:
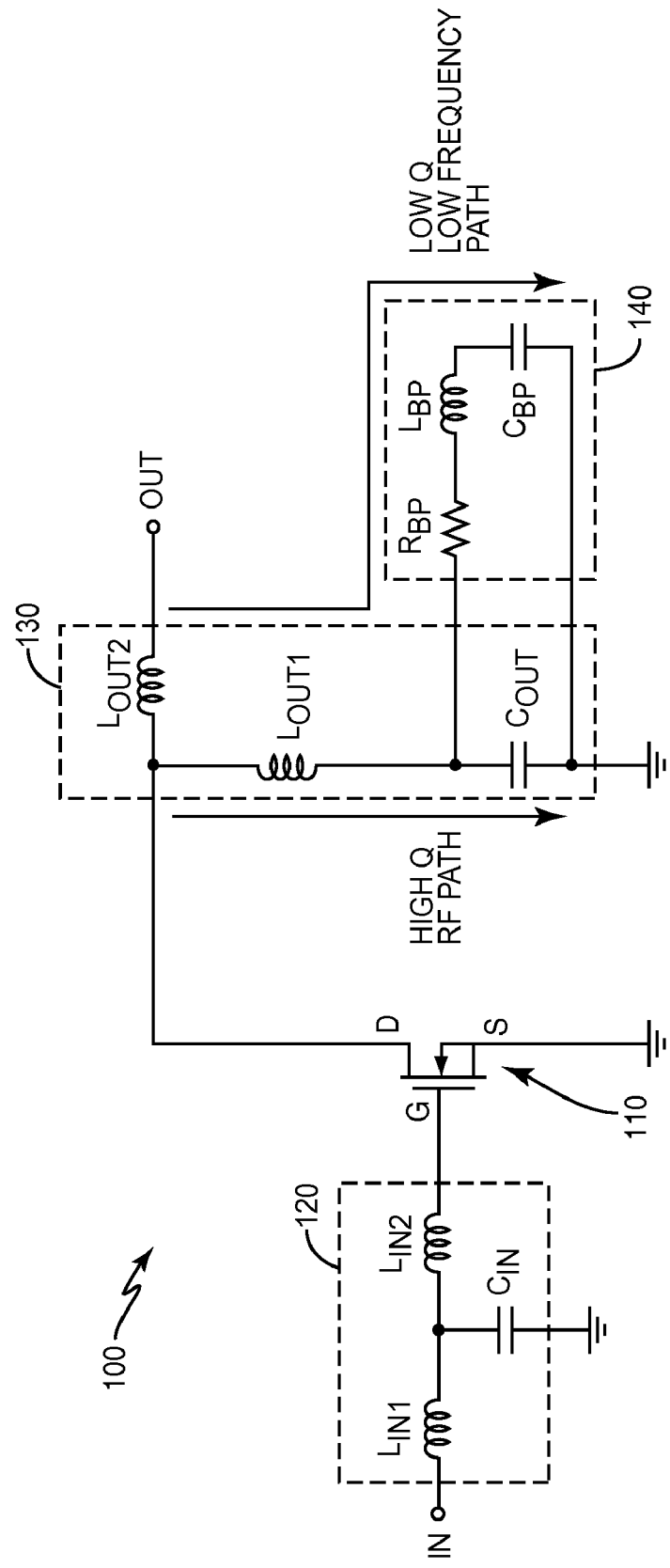
FIG. 2 illustrates another embodiment of a power circuit including a power device, an output match network and a bypass network.

FIG. 2 illustrates an embodiment of the power circuit 100 in more detail. The input match network 120 may include one or more blocking capacitors $C_{IN}$ with one plate coupled to ground and the other plate coupled to an end of a first conductive branch $L_{IN1}$ of the input match network 120. The other end of the first conductive branch $L_{IN1}$ is coupled to the input terminal (IN) of the power circuit 100. A second (or more) conductive branch $L_{IN2}$ of the input match network 120 couples $C_{IN}$ to the gate (G) of the power amplifier 110 which is an RF power transistor in this embodiment. The conductive branches $L_{IN1}$ and $L_{IN2}$ of the input match network 120 can be implemented as bond wires, ribbons, etc. The capacitor $C_{IN}$ of the input match network 120 can be implemented as a discrete component separate from the power amplifier 110 or can be integrated with the power amplifier 110 on the same die. The input match network 120 can have other configurations which are within the scope of the embodiments described herein.

The output match network 130 includes the blocking capacitor $C_{OUT}$ and a first conductive branch $L_{OUT1}$ which couples the drain (D) of the power device 110 to one plate of $C_{OUT}$. The other plate of $C_{OUT}$ is coupled to ground. A second conductive branch $L_{OUT2}$ of the output match network 130 connects the drain of the power device 110 to the RF/output terminal (OUT) of the power circuit 100 and also possibly a DC/baseband port which is not shown for ease of illustration only. The source (S) of the power device 110 is coupled to ground. The conductive branches $L_{OUT1}$ and $L_{OUT2}$ of the output match network 130 can be implemented as bond wires, ribbons, etc. The blocking capacitor $C_{OUT}$ of the output match network 120 can be implemented as a discrete component separate from the power amplifier 110 or can be integrated with the power amplifier 110 on the same die. The output match network 130 can have other configurations which are within the scope of the embodiments described herein.

The bypass network 140 includes a series connected resistive component $R_{BP}$, inductive component $L_{BP}$ and bypass capacitor $C_{BP}$ coupled in parallel with the blocking capacitor $C_{OUT}$ of the output match network 140. The inductive component $L_{BP}$ of the bypass network 140 confines RF signal energies to the high quality factor RF path of the output match network 130 as indicated by the line labeled 'High Q RF Path' in FIG. 2. This way, the high frequency performance of the power circuit 100 is essentially unaffected, or only minimally affected by the bypass network 140. In one embodiment, the inductive component $L_{BP}$ of the bypass network 140 has a resistance at least 10× greater than the resistance of the high quality factor RF path of the output match network 130 and an inductance that is greater than the inductance of the high quality factor RF path. In one embodiment, the inductive component $L_{BP}$ of the bypass network 140 has a resistance in the Ohm range (e.g. about 10Ω or greater) and an inductance in the milli-Henry range or greater, and the high quality factor RF path of the output match network 130 has a resistance in the milli-Ohm range (e.g. about 75 mΩ or less) and an inductance in the pico-Henry range. The bypass network 140 therefore has a lower quality factor i.e. is more lossy than the high quality factor RF path of the output match network 130 according to this embodiment.

The power circuit 100 is operated by coupling the output match network 130 to the output (drain) of the power amplifier 110, providing a range of high frequency impedance matching over a signal bandwidth and a low frequency gain peak outside the signal bandwidth which corresponds to a low frequency resonance of the high quality factor RF path of the output match network 130, coupling the bypass network 140 in parallel with the blocking capacitor $C_{OUT}$ of the output match network 130 and attenuating the low frequency gain peak via the bypass network 140 while maintaining the high quality factor RF path.

The inductive component $L_{BP}$ of the bypass network 140 permits low frequency signal energies to pass as indicated by the line labeled 'Low Q Low Frequency Path' in FIG. 2. This enables the series connected inductive component $L_{BP}$ and bypass capacitor $C_{BP}$ of the bypass network 140 to effectively bypass the low frequency resonance of the output match network 130 by shunting low frequency signal energies to ground. In one embodiment, the capacitance of the bypass capacitor $C_{BP}$ is about 200 pF. The capacitance of the blocking capacitor $C_{OUT}$ of the output match network 130 depends on the application in which the power circuit 100 is used, and is generally less than the capacitance of the bypass capacitor $C_{BP}$ and e.g. can be about 150 pF or less.

Figure 3:
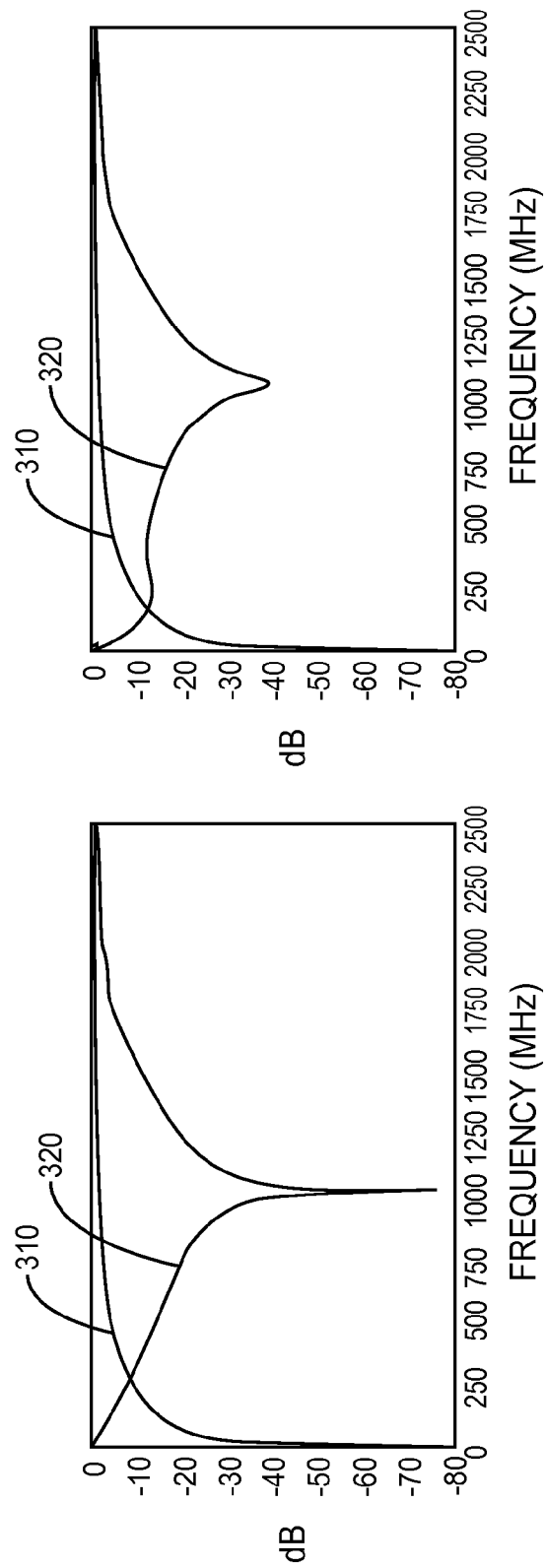
FIGS. 3A and 3B illustrate the frequency response of an output match network with and without a bypass network.

FIGS. 3A and 3B illustrate how bypassing the low frequency resonance of the output match network 130 via the bypass network 140 attenuates the low frequency gain peak in the frequency response of the output match network 130. Curve 310 of FIGS. 3A and 3B shows the cut-off response of the blocking capacitor $C_{OUT}$ of the output match network 130 as a function of frequency. Curve 320 of FIGS. 3A and 3B shows the gain response of the output match network 130 as a function of frequency. The bypass network 140 was excluded from the power circuit 100 for the simulation results shown in FIG. 3A, and included in the power circuit 100 for the simulation results shown in FIG. 3B. FIG. 3B shows that the low frequency response of the output match network 130 is reduced and smoothed in the low frequency range. For example, the low frequency response of the output match network 130 is linearly decreasing to about 750 MHz and is about −8 dB at 250 MHz without the bypass network 140 as shown in FIG. 3A. In contrast, the low frequency response of the output match network 130 is generally linear from about 200 MHz to about 500 MHz and is about −13 dB at 250 MHz with the bypass network 140 as shown in FIG. 3B. The response shown in FIG. 3B results in a reduced peak voltage at the drain (D) of the power amplifier 110 for low frequencies.

Figure 4:
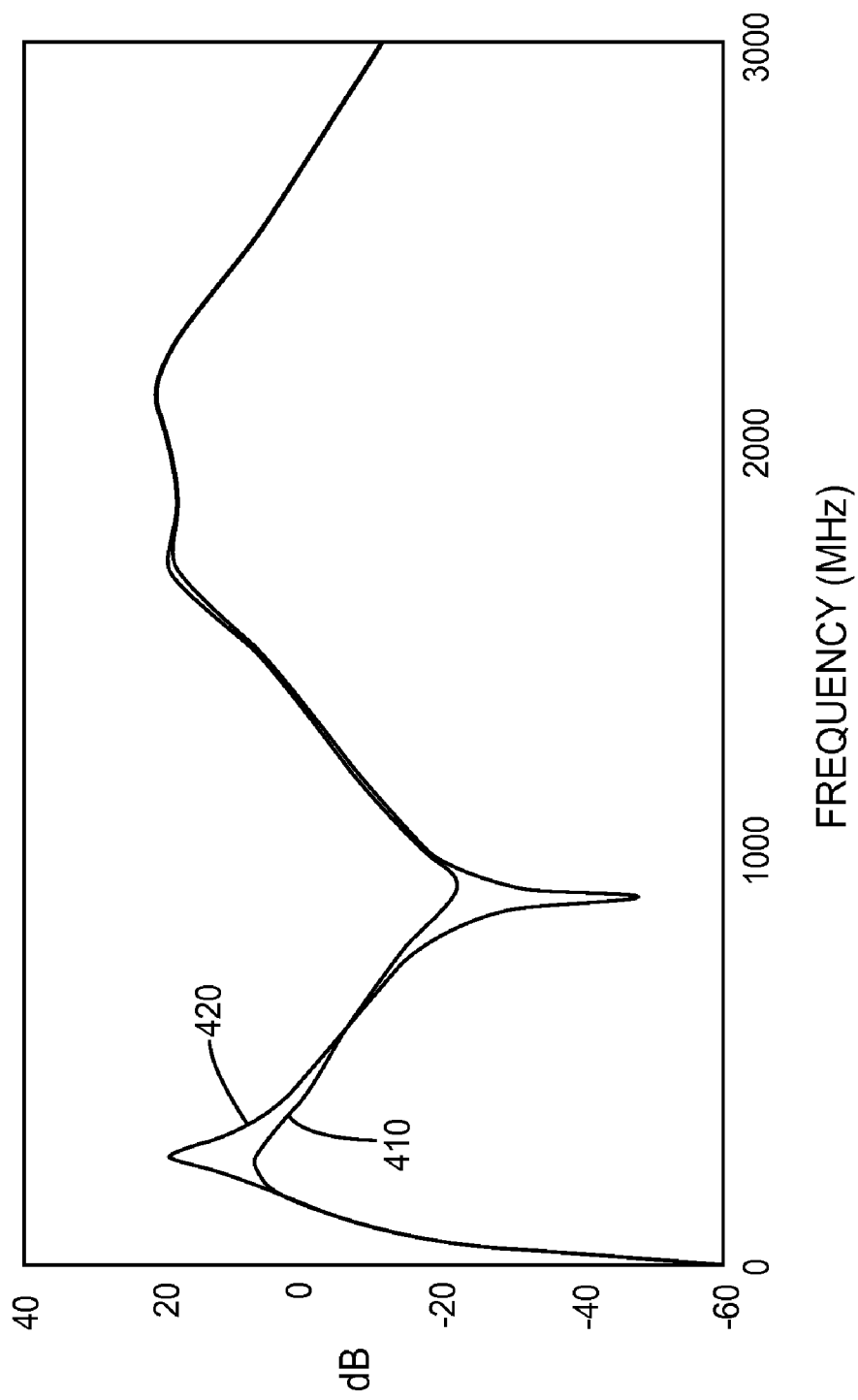
FIG. 4 illustrates the response at the output of a power circuit output with and without a bypass network.

FIG. 4, illustrates the RF performance of the power circuit 100 with the bypass network 140 (curve 410) and without the bypass network 140 (curve 420). The bypass network 140 attenuates the low frequency gain peak in the frequency response of the output match network 130 while maintaining the high quality factor RF path of the output match network 130. This way, the high frequency performance of the power circuit 100 is essentially unaffected, or only marginally affected by the bypass network 140 while reducing the peak drain voltage of the power amplifier 110 for low frequencies. As such, the peak drain voltage of the power amplifier 110 remains below the breakdown voltage in the low frequency range while ensuring proper operation of the power circuit 100 in the high frequency range.

Figure 5:
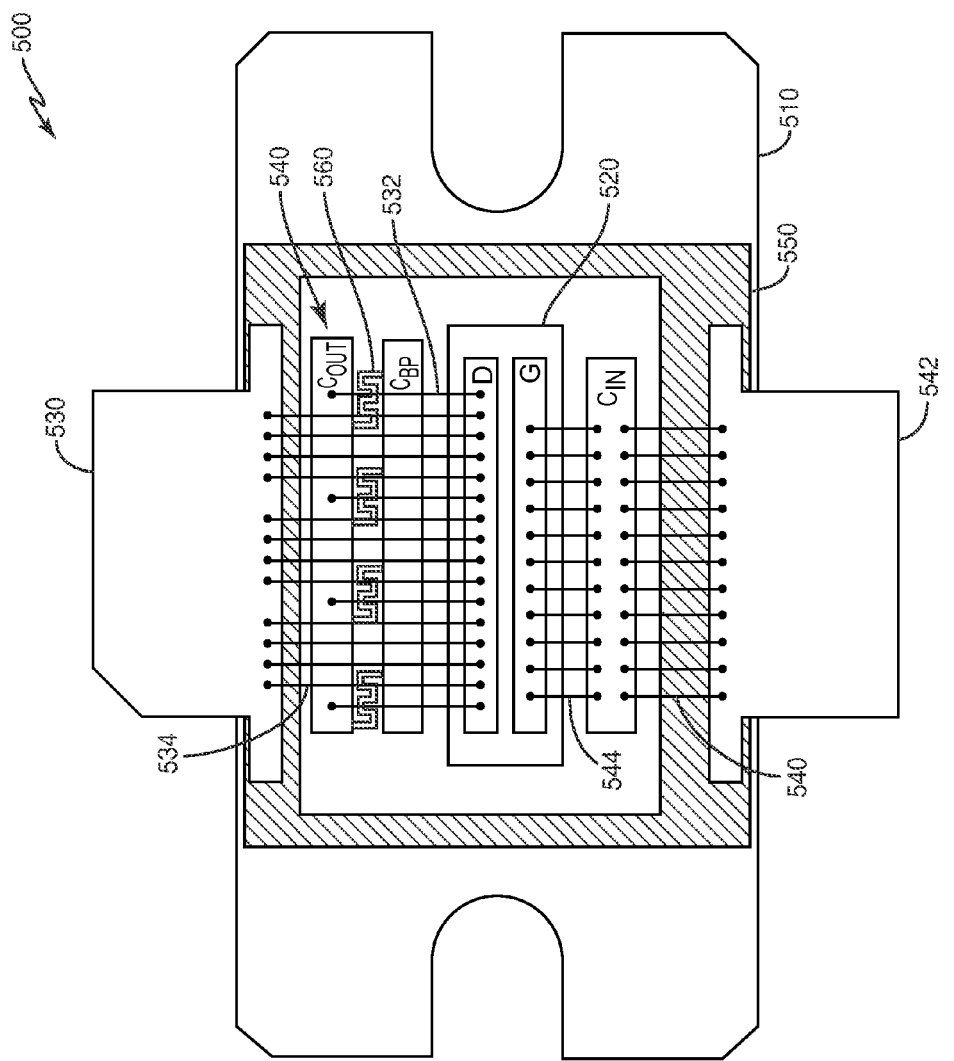
FIG. 5 illustrates an embodiment of a circuit package including a power circuit with a power device, an output match network and a bypass network.

FIG. 5 illustrates a circuit package 500 including the power circuit 100. The package 500 includes a substrate 510 such as a thermally and electrically conductive flange. The package 500 also includes a first die 520 on the substrate 510. The first die 500 includes the power amplifier 110. The output terminal 530 of the power circuit 100 is also disposed on the substrate 510 e.g. in the form of a lead. The output match network 130 couples the output (drain) of the power amplifier 110 to the output terminal 530. The blocking capacitor $C_{OUT}$ of the output match network 130 is included in a second die 540 on the substrate 510. The output match network 130 is operable to provide a range of high frequency gain over a signal bandwidth and a low frequency gain peak outside the signal bandwidth as previously explained herein. The bypass network 140 is coupled in parallel with the blocking capacitor $C_{OUT}$ of the output match network 130. The bypass network 140 is operable to attenuate the low frequency gain peak while maintaining the high quality factor RF path of the output match network 130 as previously explained herein.

On the input side of the circuit package 500, the first conductive branch $L_{IN1}$ of the input match network 120 includes a plurality of parallel bond wires 540 which connect an input terminal 542 to the top plate of the input match network capacitor $C_{IN}$. The second conductive branch $L_{IN2}$ of the input match network 120 similarly includes a plurality of parallel bond wires 544 which connect the top plate of $C_{IN}$ to the gate terminal (G) of the power amplifier 110. The bottom plate of $C_{IN}$ is connected to ground e.g. via the substrate 510 if conductive.

The first conductive branch $L_{OUT1}$ of the output match network 130 includes a plurality of parallel bond wires 532 which connect the drain terminal (D) of the power amplifier 110 to the top plate of the blocking capacitor $C_{OUT}$ of the output match network 130. The bottom plate of $C_{OUT}$ is connected to ground e.g. via the substrate 510 if conductive. The second conductive branch $L_{OUT2}$ of the output match network 130 includes a plurality of parallel bond wires 534 which connect the drain terminal of the power amplifier 110 to the output terminal 530 of the power circuit 100. The source terminal which is on the bottom side of the power amplifier 110 is connected to ground e.g. via the substrate 510 if conductive.

The inductive component $L_{BP}$ of the bypass network 140 connects the top plate of the blocking capacitor $C_{OUT}$ of the output match network 130 to the top plate of the bypass capacitor $C_{BP}$ of the bypass network 140 so that the series connected inductive component $L_{BP}$ and bypass capacitor $C_{BP}$ of the bypass network 140 are coupled in parallel with the blocking capacitor $C_{OUT}$ of the output match network 130. The bottom plate of both capacitors $C_{OUT}$ and $C_{BP}$ are coupled to ground e.g. via the substrate 510 if conductive. The terminals 530, 542 of the circuit package 500 are mounted on an insulative member 550 attached to the substrate 510. The output match network 130 can also include a third inductive branch $L_{OUT3}$ (not shown) which includes a plurality of parallel bond wires for connecting the top plate of $C_{OUT}$ to an optional DC feed/baseband termination terminal (not shown) of the power circuit 100 as described in U.S. patent application Ser. No. 12/817,869 filed on 17 Jun. 2010, the content of said application incorporated herein by reference in its entirety.

According to one embodiment, the bypass capacitor $C_{BP}$ of the bypass network 140 is integrated on the same die as the blocking capacitor $C_{OUT}$ of the output match network 130. Alternatively, bypass capacitor $C_{BP}$ and blocking capacitor $C_{OUT}$ are fabricated on separate die.

According to an embodiment, the inductive component $L_{BP}$ of the bypass network 140 includes one or more serpentine conductors 560 connecting the top plate of the bypass capacitor $C_{BP}$ to the top plate of the blocking capacitor $C_{OUT}$. The size and dimensions of each serpentine conductor 560 can be chosen to obtain a particular total inductance which optimizes the performance of the bypass network 140 in attenuating the low frequency gain peak in the frequency response of the output match network 130 while maintaining the high quality factor RF path of the output match network 130.

The circuit package 500 is fabricated by providing the substrate 510, arranging the first die 520 on the substrate 510, arranging the output and input terminals 530, 542 on the substrate 510, coupling the output (drain) of the power amplifier 110 to the output terminal 530 via the output match network 130, and coupling the bypass network 140 in parallel with the blocking capacitor $C_{OUT}$ of the output match network 130. The output of the power amplifier 110 can be coupled to the blocking capacitor $C_{OUT}$ via one or more bond wires 532 of the output match network 130 as shown in FIG. 5. The one or more bond wires 532 form part of the high quality factor RF path of the output match network 130. In one embodiment, the bypass network 140 has a resistance at least 10× greater than the resistance of the high quality factor RF path including the one or more bond wires 532 and an inductance greater than the inductance of the high quality factor RF path including the one or more bond wires 532.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power circuit, comprising:
    a power device;
    an output match network coupled to an output of the power device and including a blocking capacitor which forms part of a high quality factor RF path of the output match network, the output match network operable to provide a range of high frequency gain over a signal bandwidth and a low frequency gain peak outside the signal bandwidth which corresponds to a low frequency resonance of the high quality factor RF path; and
    a bypass network coupled in parallel with the blocking capacitor of the output match network, the bypass network comprising a series connected inductive component and capacitor coupled in parallel with the blocking capacitor of the output match network, wherein the inductive component of the bypass network is operable to confine RF signal energies to the high quality factor RF path of the output match network and wherein the bypass network is operable to attenuate the low frequency gain peak while maintaining the high quality factor RF path.

2. The power circuit of claim 1, wherein the bypass network has a resistance at least 10× greater than the resistance of the high quality factor RF path and an inductance that is greater than the inductance of the high quality factor RF path.

3. The power circuit of claim 1, wherein the bypass network has a lower quality factor than the high quality factor RF path of the output match network.

4. The power circuit of claim 1, wherein the low frequency gain peak occurs between 1 and 300 MHz.

5. A method of operating a power circuit, including:
    coupling an output match network to an output of a power device, the output match network including a blocking capacitor which forms part of a high quality factor RF path;
    providing a range of high frequency gain over a signal bandwidth and a low frequency gain peak outside the signal bandwidth which corresponds to a low frequency resonance of the high quality factor RF path;
    coupling a bypass network in parallel with the blocking capacitor of the output match network, the bypass network comprising a series connected inductive component and capacitor coupled in parallel with the blocking capacitor of the output match network, wherein the inductive component of the bypass network is operable to confine RF signal energies to the high quality factor RF path of the output match network; and
    attenuating the low frequency gain peak via the bypass network while maintaining the high quality factor RF path.

6. The method of claim 5, comprising bypassing the low frequency resonance of the high quality factor RF path via the bypass network so that a peak drain voltage at the power device remains below a breakdown voltage of the power device.

7. The method of claim 5, comprising:
    multiplying a signal having a bandwidth in the gigahertz range with a signal having a bandwidth in the megahertz range via the power device so that the low frequency gain peak occurs between 1 and 300 MHz; and
    attenuating the low frequency gain peak between 1 and 300 MHz via the bypass network.

8. A circuit package, comprising:
    a substrate;
    a first die on the substrate, the first die including a power device;
    an output terminal on the substrate;
    an output match network coupling an output of the power device to the output terminal, the output match network including a blocking capacitor which forms part of a high quality factor RF path, the blocking capacitor included in a second die on the substrate, the output match network operable to provide a range of high frequency gain over a signal bandwidth and a low frequency gain peak outside the signal bandwidth; and
    a bypass network coupled in parallel with the blocking capacitor of the output match network, the bypass network comprising a series connected inductive component and bypass capacitor coupled in parallel with the blocking capacitor of the output match network, wherein the inductive component of the bypass network is operable to confine RF signal energies to the high quality factor RF path of the output match network and wherein the bypass network is operable to attenuate the low frequency gain peak while maintaining the high quality factor RF path.

9. The circuit package of claim 8, wherein the bypass capacitor is integrated on the same die as the blocking capacitor.

10. The circuit package of claim 9, wherein the inductive component is a serpentine conductor connecting a plate of the blocking capacitor to a plate of the bypass capacitor.

11. The circuit package of claim 10, wherein the serpentine conductor is operable to confine RF signal energies to the high quality factor RF path of the output match network.

12. The circuit package of claim 8, wherein the output match network comprises one or more bond wires coupling the output of the power device to the blocking capacitor, the one or more bond wires form part of the high quality factor RF path, and the bypass network has a resistance at least 10× greater than the resistance of the high quality factor RF path and an inductance greater than the inductance of the high quality factor RF path.

13. A method of fabricating a circuit package, comprising:
providing a substrate;
arranging a first die on the substrate, the first die including a power device:
arranging an output terminal on the substrate;
coupling an output of the power device to the output terminal via an output match network including a blocking capacitor which forms part of a high quality factor RF path, the blocking capacitor included in a second die on the substrate, the output match network operable to provide a range of high frequency gain over a signal bandwidth and a low frequency gain peak outside the signal bandwidth; and
coupling a bypass network in parallel with the blocking capacitor of the output match network, the bypass network comprising a series connected inductive component and bypass capacitor coupled in parallel with the blocking capacitor of the output match network, wherein the inductive component of the bypass network is operable to confine RF signal energies to the high quality factor RF path of the output match network and wherein the bypass network is operable to attenuate the low frequency gain peak while maintaining the high quality factor RF path.

14. The method of claim 13, comprising coupling the output of the power device to the blocking capacitor via one or more bond wires of the output match network, the one or more bond wires forming part of the high quality factor RF path, and wherein the bypass network has a resistance at least 10× greater than the resistance of the high quality factor RF path and an inductance greater than the inductance of the high quality factor RF path.

* * * * *